US012651626B2

(12) United States Patent
Kim et al.

(10) Patent No.: US 12,651,626 B2
(45) Date of Patent: Jun. 9, 2026

(54) SEMICONDUCTOR MEMORY DEVICE

(71) Applicant: KOREA ADVANCED INSTITUTE OF SCIENCE AND TECHNOLOGY, Daejeon (KR)

(72) Inventors: Kyung Min Kim, Daejeon (KR); Jae Hyun In, Daejeon (KR); Gwangmin Kim, Daejeon (KR); Younghyun Lee, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 131 days.

(21) Appl. No.: 17/976,242

(22) Filed: Oct. 28, 2022

(65) Prior Publication Data

US 2023/0134585 A1 May 4, 2023

(30) Foreign Application Priority Data

Oct. 29, 2021 (KR) ......................... 10-2021-0146697

(51) Int. Cl.
G11C 11/406 (2006.01)
G11C 5/02 (2006.01)
G11C 7/04 (2006.01)
(52) U.S. Cl.
CPC ........ G11C 11/40626 (2013.01); G11C 5/025 (2013.01); G11C 7/04 (2013.01)
(58) Field of Classification Search
CPC ...... G11C 11/40626; G11C 5/025; G11C 7/04
(Continued)

(56) References Cited

U.S. PATENT DOCUMENTS 11,348,639 B2 * 5/2022 Lee ......................... G11C 29/52
2017/0084824 A1 * 3/2017 Bauer ................ H10N 70/8833
(Continued)

FOREIGN PATENT DOCUMENTS

KR          10-1391159 B1    5/2014
KR     10-2017-0068346 A    6/2017
(Continued)

OTHER PUBLICATIONS

Office Action issued in Korean Appl. No. 10-2021-0146697 dated Jun. 26, 2024.
(Continued)

*Primary Examiner* — Amir Zarabian
*Assistant Examiner* — Daniel John King
(74) *Attorney, Agent, or Firm* — Foley & Lardner LLP

(57) ABSTRACT

Disclosed herein is a semiconductor memory device. Provided is the semiconductor memory device includes a first device layer storing thermal energy and a second device layer being made of a material whose electrical properties are changed by the thermal energy, wherein the first device layer stores thermal energy if a voltage is applied to the second device layer. Since the device is composed of a material that is changed electrical characteristics by heat and a material that stores heat, it may be read as a current applied to the read voltage without applying other refresh voltage. In addition, there is no leakage current flowing through the device depending on the characteristics of the device, so additional circuit elements such as transistors and selectors are not required. The device has a fast-switching mechanism but does not cause leakage current thereby not showing resistance drift due to repetitive switching.

11 Claims, 10 Drawing Sheets

(58) Field of Classification Search
    USPC .......................................................... 365/148
    See application file for complete search history.

(56)                        References Cited

U.S. PATENT DOCUMENTS

2017/0186813 A1*   6/2017   Kim ....................... H10N 70/24
2018/0331188 A1*  11/2018   Eom .................. H10D 30/6755

FOREIGN PATENT DOCUMENTS

KR        10-2018-0100025  A        9/2018
KR        10-2019-0048050  A        5/2019
KR        10-2019-0123976  A       11/2019

OTHER PUBLICATIONS

Office Action issued in Korean Appl. No. 10-2021-0146697 dated
Sep. 27, 2023.
Gwangmin Kim et al., "Enhancing Johnson-Nyquist noise for
high-performance Mott memristor-based oscillatory TRNG", npj
Unconventional Computing, (2025) 2:12, pp. 1-8.
Gwangmin Kim et al., "Mott neurons with dual thermal dynamics
for spatiotemporal computing", Nature Materials, vol. 23, pp.
1237-1244, Sep. 2024.
Gwangmin Kim et al., "Self-clocking fast and variation tolerant true
random No. generator based on a stochastic mott memristor",
Nature Communications, (2021) 12:2906, pp. 1-8, May 18, 2021.
Sanjoy Kumar Nandi et al., "Temperature dependent frequency
tuning of NbOx relaxation oscillators", Applied Physics Letters,
Nov. 14, 2017, vol. 111, pp. 202901-1-202901-4.

* cited by examiner

SEMICONDUCTOR MEMORY DEVICE

CROSS REFERENCE

This application claims priority to and the benefit of Korean Patent Application No 10-2021-0146697 filed in the Korean Intellectual Property Office on Oct. 29, 2021, the entire contents of which are incorporated herein by reference.

BACKGROUND

1. Technical Field

The present invention relates to a semiconductor memory device in which electrical characteristics are changed by heat.

2. Description of the Related Art

Semiconductor devices are in the spotlight as an important factor in the electronics industry due to characteristics such as miniaturization, multifunctionality, and low manufacturing cost. As the electronic industry is highly developed, the tendency of semiconductor devices to be highly integrated is intensifying.

For example, Dynamic Random Access Memory (DRAM), NAND Flash Memory (NAND Flash Memory), and Phase-Change RAM (PRAM) are considered representative semiconductor memory devices.

In DRAM, electrical leakage occurs due to charge leakage in the electric capacitor, and it is difficult to integrate it because it requires a transistor to prevent electrical leakage.

NAND flash has a limitation in the mechanism in the programming operation, making it difficult to use it as a main memory for operation.

PRAM changes the crystal structure using thermal energy, it repeatedly undergoes a melting-quenching process, which causes a resistance drift, making it difficult to operate stably.

Therefore, it is necessary to research and develop a new type of semiconductor memory device that can be integrated, used as the main memory, and can operate stably.

SUMMARY

It is an object of the present invention to provide a semiconductor memory device in which electrical characteristics are changed by heat. Various aspects of the present invention are directed to providing a semiconductor memory device. An embodiment of the present invention includes a first device layer storing thermal energy and a second device layer including a material whose electrical properties are changed by thermal energy. The first device layer stores thermal energy if a voltage is applied to the second device layer.

The second device layer includes a first layer made of an electrically conductive material and a third layer made of an electrically conductive material. Also, the second device layer includes a second layer which is disposed between the first layer and the third layer, and whose electrical characteristics are changed by the thermal energy.

In the first layer, materials selected from a group consisting of metallic materials, semiconductive materials, or organic materials comprising Pt, Ti, Ag, Au, Ru, TiN, W, Al, ITO, ZnO, IGZO, ITZO, NiO, SnO₂, Graphene, or MoS₂, may be used as the conductive material. In the third layer, materials selected from a group consisting of metallic materials, semiconductive materials, or organic materials comprising Pt, Ti, Ag, Au, Ru, TiN, W, Al, ITO, ZnO, IGZO, ITZO, NiO, SnO₂, Graphene, or MoS₂, may be used as the conductive material.

The second device layer may include at least one layers whose electrical properties are changed by thermal energy.

In addition, the second layer may be made of a material whose resistance changes by temperature, or a material in which metal-insulator transition occurs at a specific temperature.

The material may be a resistance change material including one or more selected from a group consisting of metal oxide-based, high molecular polymer-based, or low molecular compound-based material including vanadium oxide ($VO_x$), niobium oxide ($NbO_x$), tantalum oxide ($TaO_x$), germanium antimony telluride ($Ge_2Sb_2Te_5$) or zinc telluride ($ZnTe$).

The first device layer comprises at least one layers, and is disposed at under portion, at a side portion, or at an upper portion of the second device layer, or is formed to surround the second device layer, and may be made of a material selected from the group consisting of high molecular polymer-based or metal oxide-based including polyimide, polyethylene terephthalate, polyether-sulfone, polyethylene naphthalate, polycarbonate, silicon (Si), silicon dioxide ($SiO_2$), glass, or aluminum oxide ($AlO_x$).

When thermal energy is not stored in the first device layer, if a read voltage is applied, a current may not flow in the second device layer.

Also, in the case thermal energy is stored in the first device layer, a current may flow in the second device layer if a read voltage is applied.

If a programming voltage is applied, thermal energy is generated in the second layer of the second device layer by the applied voltage, thereby the thermal energy may be stored in the first layer.

Also, thermal energy may be stored when heat is generated by the programming voltage in the first device layer and a refresh operation for maintaining thermal energy stored in the first device layer by the read voltage may be included.

An operation of periodically applying the read voltage in a form of a voltage pulse train to periodically reading 0 or 1 depending on a presence or absence of current in the second device layer may be included, and a driving method may be included that thermal energy is not generated when the current state of the second device layer is 0 by the read voltage, thereby the current state is maintained at 0 by maintaining the thermal energy of the first device layer.

An operation of periodically applying the read voltage in a form of a voltage pulse train to periodically reading 0 or 1 depending on a presence or absence of current in the second device layer may be included, and a driving method may be included that thermal energy is generated when the current state of the second device layer is 1 by the read voltage to perform a refresh operation with the read voltage, thereby the current state is maintained at 1 by maintaining the thermal energy of the first device layer.

According to an exemplary embodiment, since the material is composed of a material whose electrical characteristics are changed by heat and a material that stores heat, it is possible to read the current when the read voltage is applied without applying a separate refresh voltage.

According to the exemplary embodiment, since the device is composed of a material that is changed electrical characteristics by heat and a material that stores heat, it may be read as a current applied to the read voltage without applying other refresh voltage.

According to an exemplary embodiment, there is no leakage current flowing through the device depending on the characteristics of the device, so additional circuit elements such as transistors and selectors are not required.

According to an exemplary embodiment, the device has a fast-switching mechanism but does not cause leakage current thereby not showing resistance drift due to repetitive switching.

BRIEF DESCRIPTION OF THE DRAWINGS

The various features of the present disclosure will now be described with reference to the drawing of the various aspects disclosed herein. In the drawings, the same components may have the same reference numerals. The illustrated aspects are intended to illustrate, but not limit the present disclosure. The drawings include the following figures.

DETAILED DESCRIPTION

Hereinafter, preferred embodiments of the present invention will be described in detail concerning the attached drawings.

However, the technical idea of the present invention is not limited to some of the described embodiments but may be implemented in various forms, and one or more of the components may be selectively combined and replaced between the embodiments within the technical idea of the present invention.

The terms (including technical and scientific terms) used in the embodiments of the present invention, unless explicitly specifically defined and stated, can be interpreted as generally understood by those with ordinary knowledge in the technical field to which this invention belongs, and commonly used terms such as predefined terms can be interpreted by considering the context of the relevant technology.

The terms used in the embodiments of the present invention are intended to describe the embodiments and not intended to limit the present invention.

In the specification, a singular form may include the plural form unless specified in the phrase. Also when it is described as "at least one (one or more) of "A else (and) B, C"", it may include one or more of all combinations that can be combined with A, B, and C.

In describing the components of the embodiment of the present invention, terms such as first, second, A, B, (a), and (b) may be used.

These terms are intended to distinguish the components from other components, and are not limited to the essence, sequence, or order of the components by the term.

When it is described that a component is 'connected', 'combined', or 'contact' with another component, the component is not only directly connected, combined, or in contact with another component, it may also include the case of 'connected', ' combined' or ' contact' due to other components between one component and another component.

When described as being formed or placed in "upper (on) or lower (under)" of each component, upper (on) or lower (under) includes not only when two components are directly in contact with each other, but it may also include the case of one or more other components are formed or placed between the two components. In addition, when expressed as "upper (on) or lower (under)" it may contain the meaning of the downward direction as well as the upward direction based on one component.

A semiconductor memory device according to an embodiment is composed of the material whose electrical characteristics are changed by heat and the material for storing heat, and it will be referred to as Thermal Dynamic RAM (TDRAM). It is not limited to the structures and materials of the semiconductor memory devices presented below, and it may apply to general material and device structures in which electrical properties are changed by heat.

Figure 1:
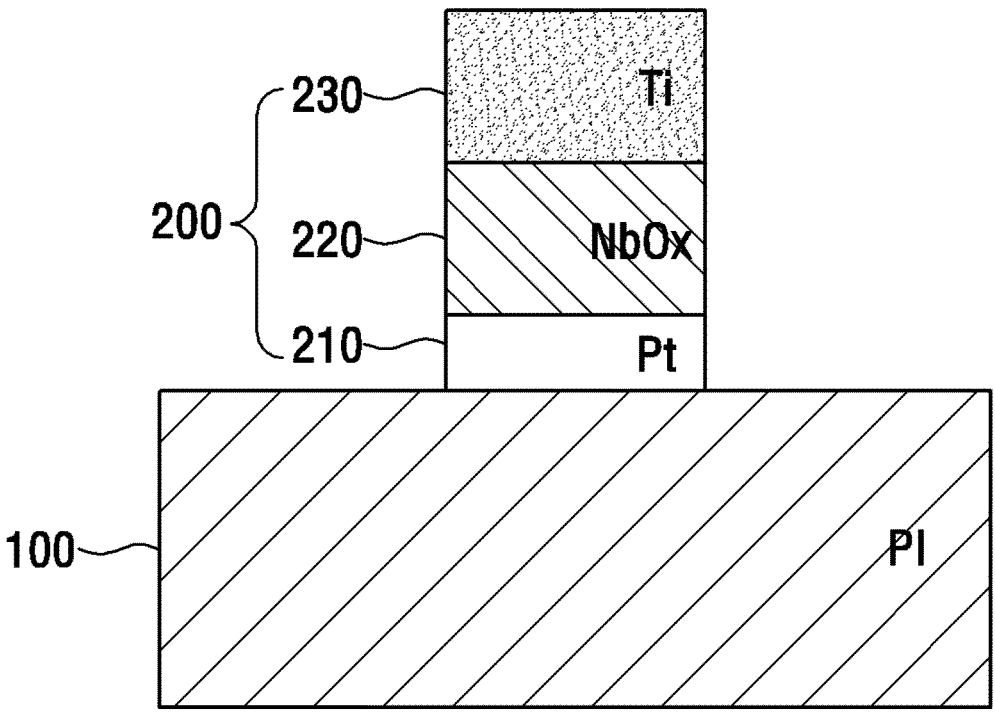
FIG. 1 schematically illustrates the semiconductor memory device according to an exemplary embodiment.

FIG. 1 is an illustration of the semiconductor memory device according to an exemplary embodiment of the present invention.

Referring to FIG. 1, the semiconductor memory device according to an embodiment of the present invention may include a first device layer 100 and a second device layer 200, and the second device layer 200 may include a first layer 210, a second layer 220, and a third layer 230.

The second device layer 200 may be made of a material whose electrical properties are changed by ambient heat and serves as a switch. The second device layer 200 may have a metal-insulator-metal (MIM) structure in which the first layer 210, the second layer 220, and the third layer 230 are sequentially stacked. However, it is sufficient if the second layer 220 is disposed of between the first layer 210 and the third layer 230, and it is not necessary to have the stacked structure.

That is, the second device layer 200 is disposed between the first layer 210 made of an electrically conductive material and the third layer 230 made of an electrically conductive material. The second device layer includes the second layer 220 whose electrical characteristics are changed by thermal energy.

The first layer 210 may include an electrically conductive material. As the conductive material, for example, Pt, Ti, Ag, Au, Ru, TiN, W, Al, ITO, ZnO, IGZO, ITZO, NiO, $SnO_2$, graphene, or $MoS_2$ may be selected.

The second layer 220 which is disposed between a first layer 210 and a third layer 230 may include resistance changes material according to temperature. For example, there is the resistance change material comprises one or more selected from the group consisting of metal oxide-based, high molecular polymer-based, or low molecular compound-based material including vanadium oxide ($VO_x$), niobium oxide ($NbO_x$), tantalum oxide ($TaO_x$), germanium antimony telluride ($Ge_2Sb_2Te_5$), or zinc telluride (ZnTe).

A third layer 230 may be made of a metallic material. As the metallic material, for example, Pt, Ti, Ag, Au, Ru, TiN, W, Al, ITO, ZnO, IGZO, ITZO, NiO, $SnO_2$, graphene, or $MoS_2$ may be selected.

The first device layer 100 may be comprised of at least one layers adjacent to the second device layer 200. The first device layer 100 may be made adjacent to the second device layer 200 to control the temperature of the second device layer.

The first device layer 100 may be made of a material storing heat. For example, the first device layer 100 may be made of a material selected from the group consisting of high molecular polymer-based, or metal oxide-based including polyimide, polyethylene terephthalate, polyethersulfone, polyethylene naphthalate, polycarbonate, silicon (Si), silicon oxide ($SiO_2$), glass (Glass), or aluminum oxide ($AlO_x$), but is not limited thereto.

According to the exemplary embodiment, the semiconductor memory device stores information in the form of thermal energy and does not cause electrical leakage even when thermal energy is leaked.

Figure 2A:
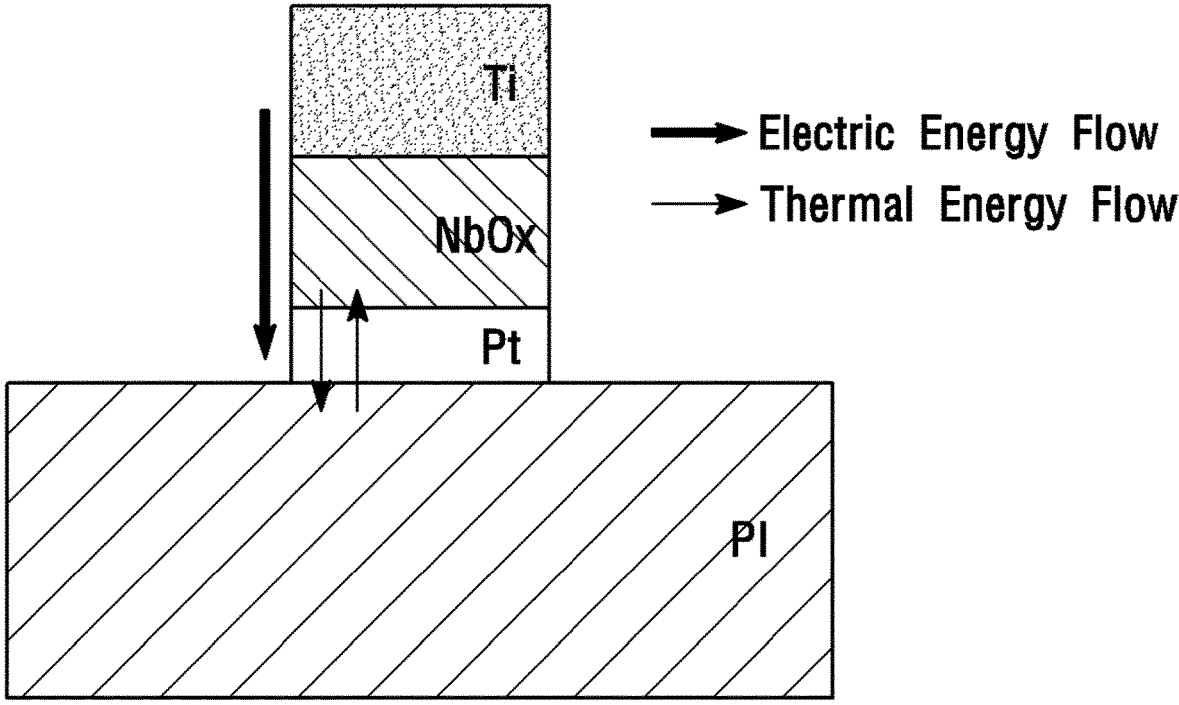
FIG. 2A illustrates electric and thermal energy flows in the semiconductor memory device of FIG. 1.
Figure 2B:
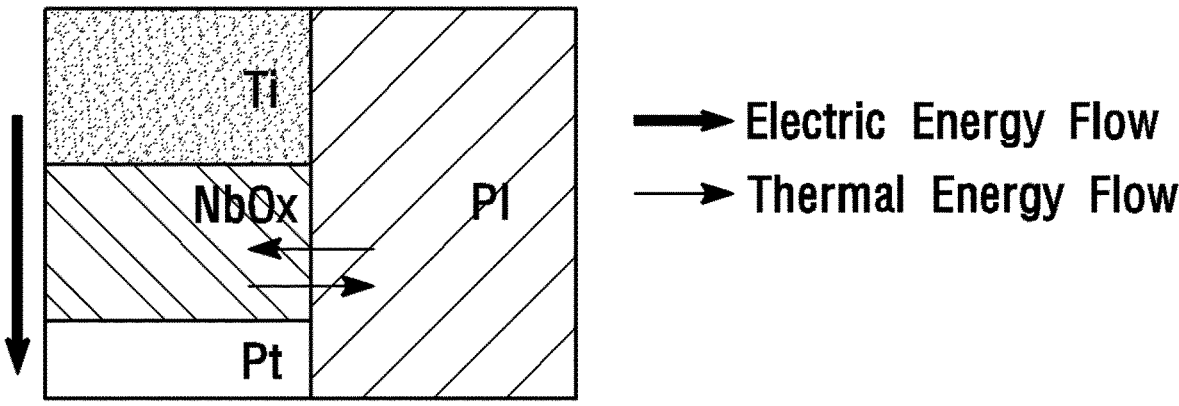
FIG. 2B illustrates electric and thermal energy flows in the semiconductor memory device of FIG. 1.

FIGS. 2A and 2B are diagrams illustrating electric and thermal energy flows of the semiconductor memory device illustrated in FIG. 1.

The first device layer 100 is disposed to store thermal energy generated in the second device layer 200. It may be disposed at an under portion, at a side portion, or at an upper portion of the second device layer, or is formed to surround the second device layer 200. The first device layer 100 may be disposed of where thermal energy can be reached, it is not limited to a specific location.

Figure 3A:
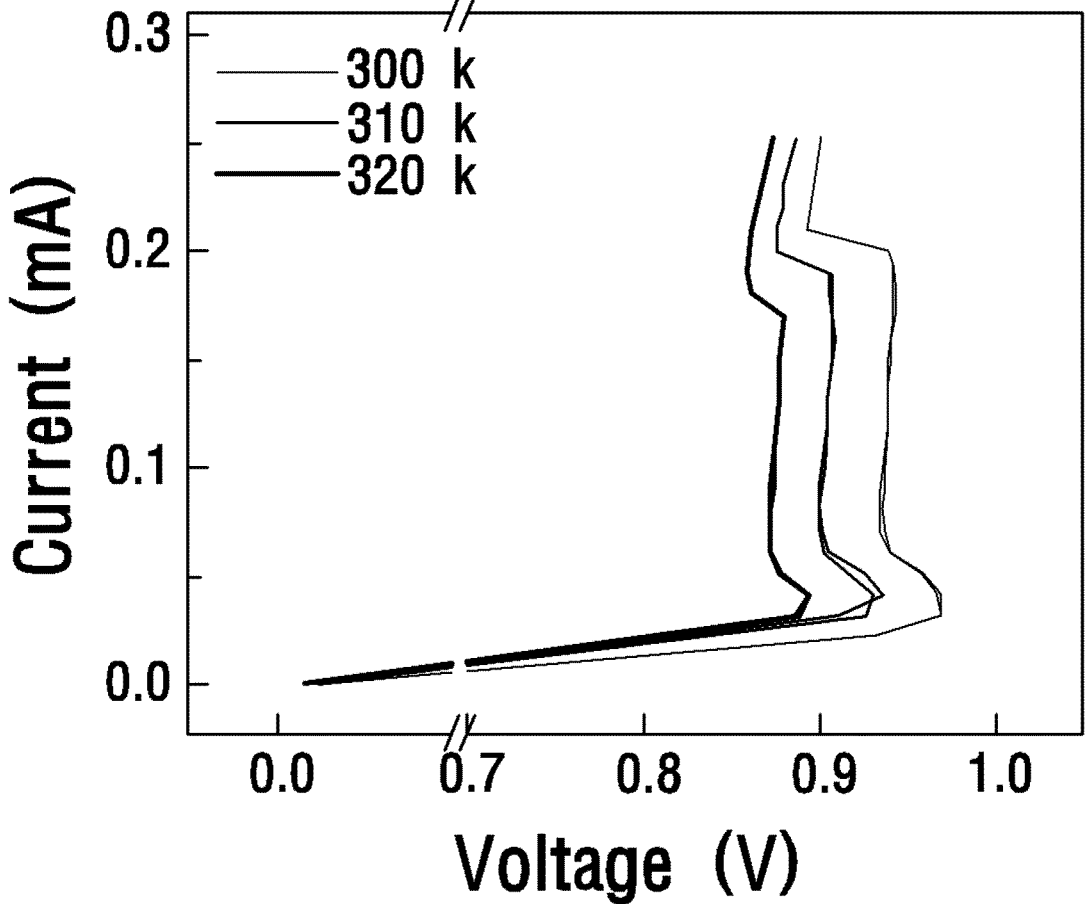
FIG. 3A illustrates NDR changes depending on temperature and voltage.
Figure 3B:
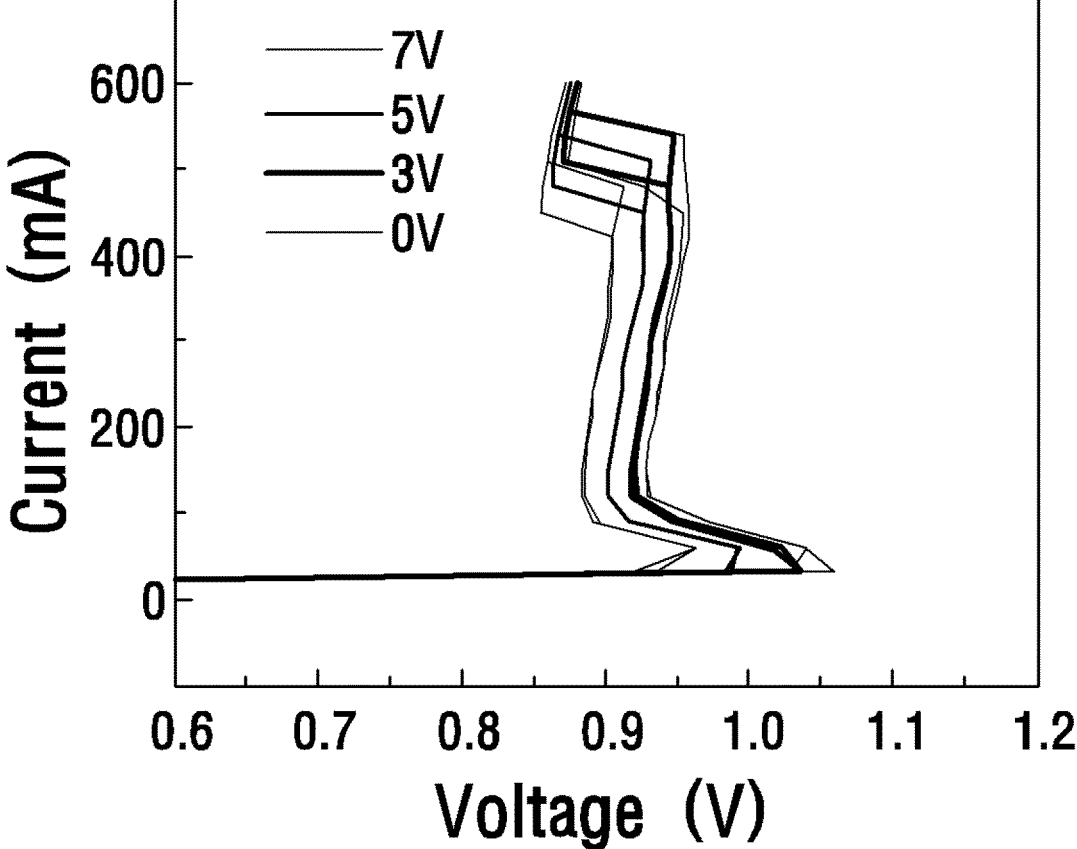
FIG. 3B illustrates NDR changes depending on temperature and voltage.

FIGS. 3A and 3B are diagrams illustrating NDR changes according to temperature and voltage.

Referring to FIGS. 2A and 2B, the first device layer 100 may store thermal energy when the ambient temperature rises. In this case, the ambient temperature may be controlled by heat generated by the current of the device or it may be controlled using a hot plate or the like.

If thermal energy is stored in the second device layer 200, the electrical characteristics of the material including of the second device layer 200 are changed by the stored thermal energy, so that the flow of electrical energy may be confirmed.

FIG. 3A shows the NDR change according to the ambient temperature change, and FIG. 3B shows the NDR change according to the voltage applied to the heater for controlling the temperature. The NDR refers to a phenomenon in which the curve of the current-voltage characteristic graph appears nonlinearly like the shape of an alphabet 'S'. Contrary to general characteristics, this NDR characteristic shows that the voltage rather decreases when the applied current amount increases in a specific range. The NDR characteristic was caused by a phenomenon in which the voltage drop between the two electrodes was rapidly decreased. This is a phenomenon that occurs when the quantum hybridization state collapses after a specific voltage.

Figure 4:
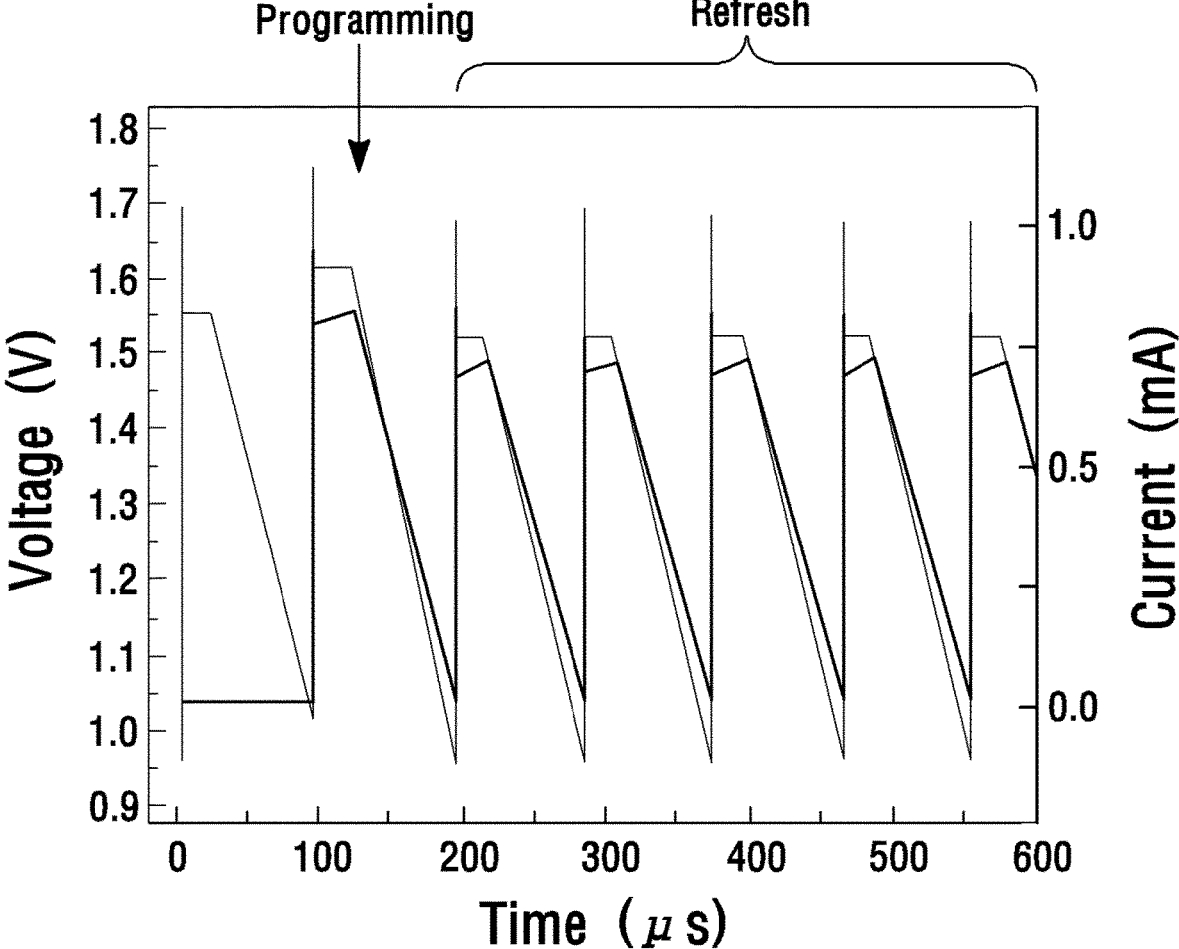
FIG. 4 illustrates the driving method of the semiconductor memory device according to an exemplary embodiment.

FIG. 4 is the diagram illustrating a driving method of a semiconductor memory device according to an embodiment of the present invention.

Referring to FIG. 4, the semiconductor memory device according to the exemplary embodiment may be programmed after accumulating heat by applying a programming voltage to the switching material, that is, the second device layer 200.

Referring again to FIGS. 2A and 2B, when an electric field is applied from the first layer to the third layer, the current flows through the second layer. That is, heat is generated inside the second layer due to Joule heating (heat is generated by the current passing through the conductor), and the material inside the second layer is changed from an insulating state to a conductive state by the heat.

At this time, ambient heat may also affect the temperature of the second layer.

A read voltage may be applied to the second device layer 200 and a current may be read to distinguish a state (e.g., 0 or 1). In this case, the reading process may include a refresh process.

That is, the semiconductor memory device according to the exemplary embodiment, may be capable of simultaneously performing the refresh process and the reading process without performing other read processes for reading a current.

Figure 5:
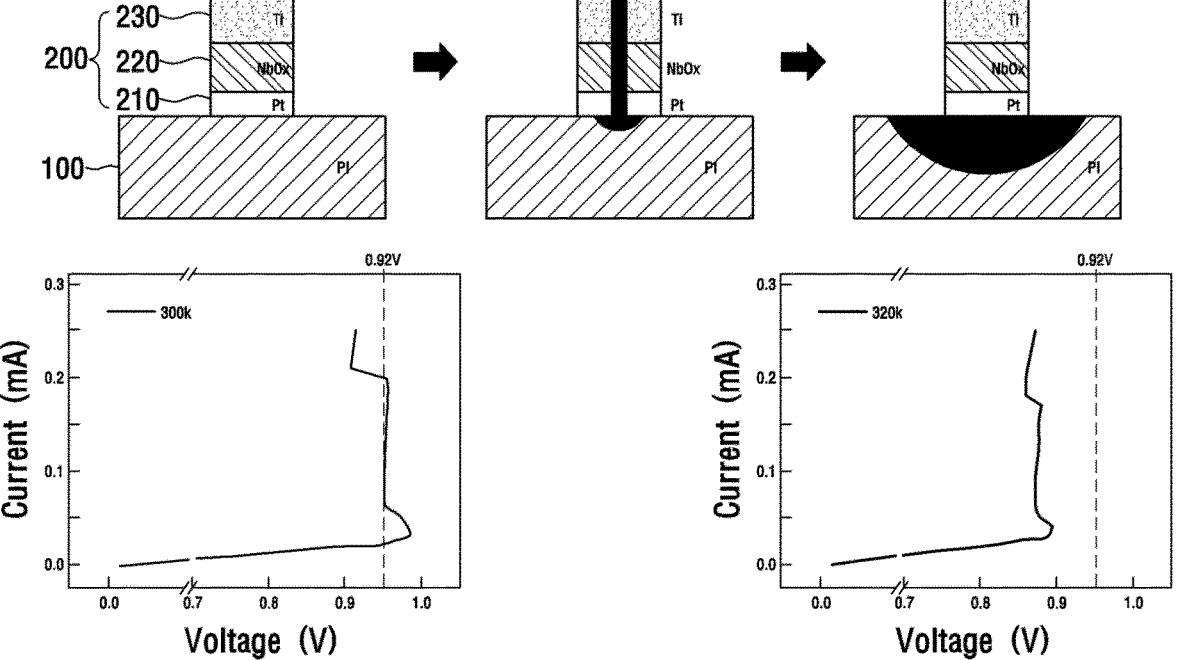
FIG. 5 illustrates explaining the operating principle of the semiconductor memory device according to an exemplary embodiment.

FIG. 5 is a diagram illustrating an operating principle of a semiconductor memory device according to an exemplary embodiment.

Referring to FIG. 5 if little voltage, for example, 0.92V is applied to the second device layer 200 in a state in which information is not stored since the second device layer 200 is not switched, the second device layer 200 is switched, and changed to a state in which information is stored. In this case, the storage of information may be accomplished by accumulating heat in the first device layer 100 by switching the second layer 220 constituting the second device layer 200 by the applied voltage.

Figure 6A:
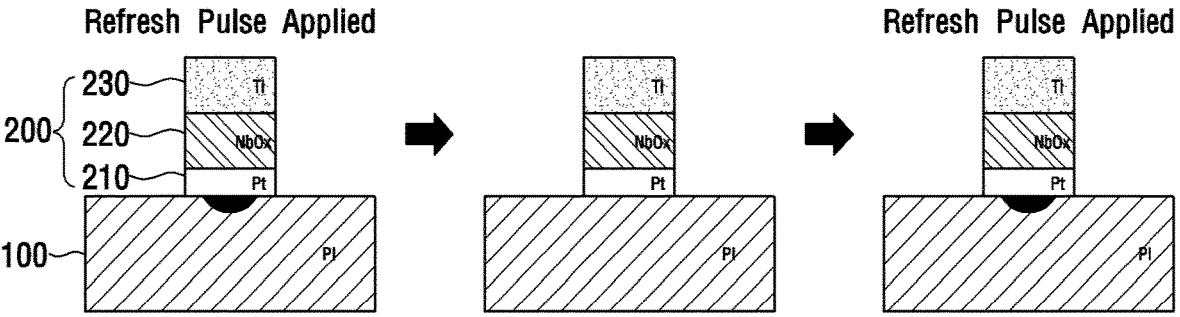
FIG. 6A illustrates explaining an operation with an unprogrammed state.
Figure 6B:
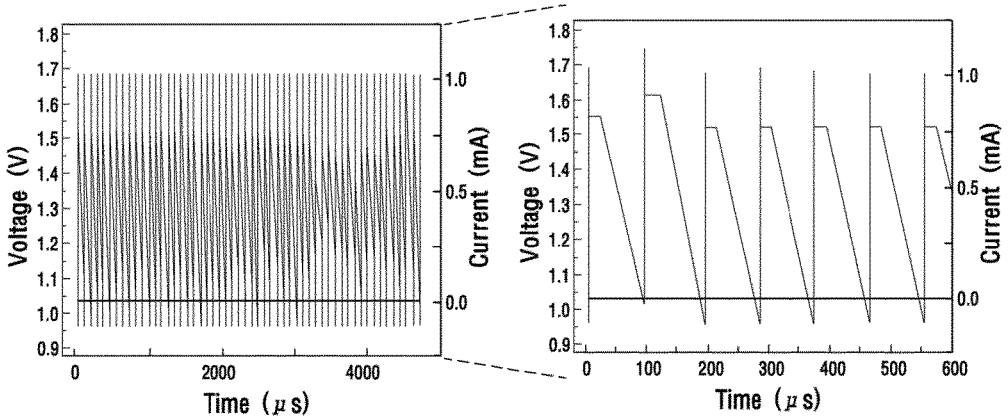
FIG. 6B illustrates explaining an operation with an unprogrammed state.

FIGS. 6A and 6B are diagrams for explaining an operation in the unprogrammed state.

Referring to FIGS. 6A and 6B, if heat is not accumulated in the first device layer 100, in case of the unprogrammed state, even if the read voltage is applied, it is not programmed.

That is, when the read voltage is applied, the switching material of the second device layer 200 becomes a state in which no current flows (0 or off), so programming is not performed.

Figure 7A:
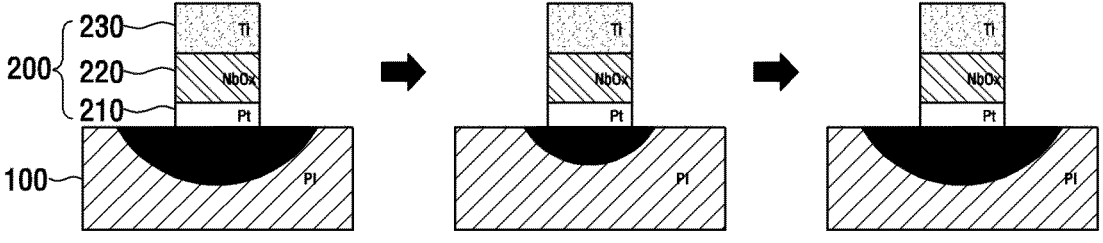
FIG. 7A illustrates explaining an operation with a programmed state.
Figure 7B:
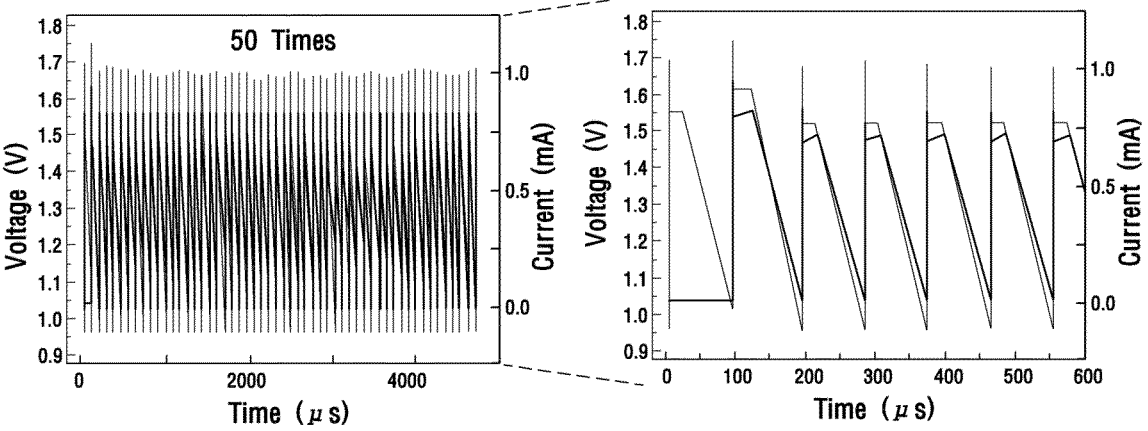
FIG. 7B illustrates explaining an operation with a programmed state.

FIGS. 7A and 7B are diagrams for explaining an operation in the programmed state.

Referring to FIGS. 7A and 7B, if heat is accumulated in the first device layer 100, in the case of the programmed state, the stored thermal energy is maintained when a read voltage is applied.

That is, when a read voltage is applied, the switching material of the second device layer 200 becomes a state in which no current flows (0 or off), so programming is not performed.

Figure 8:
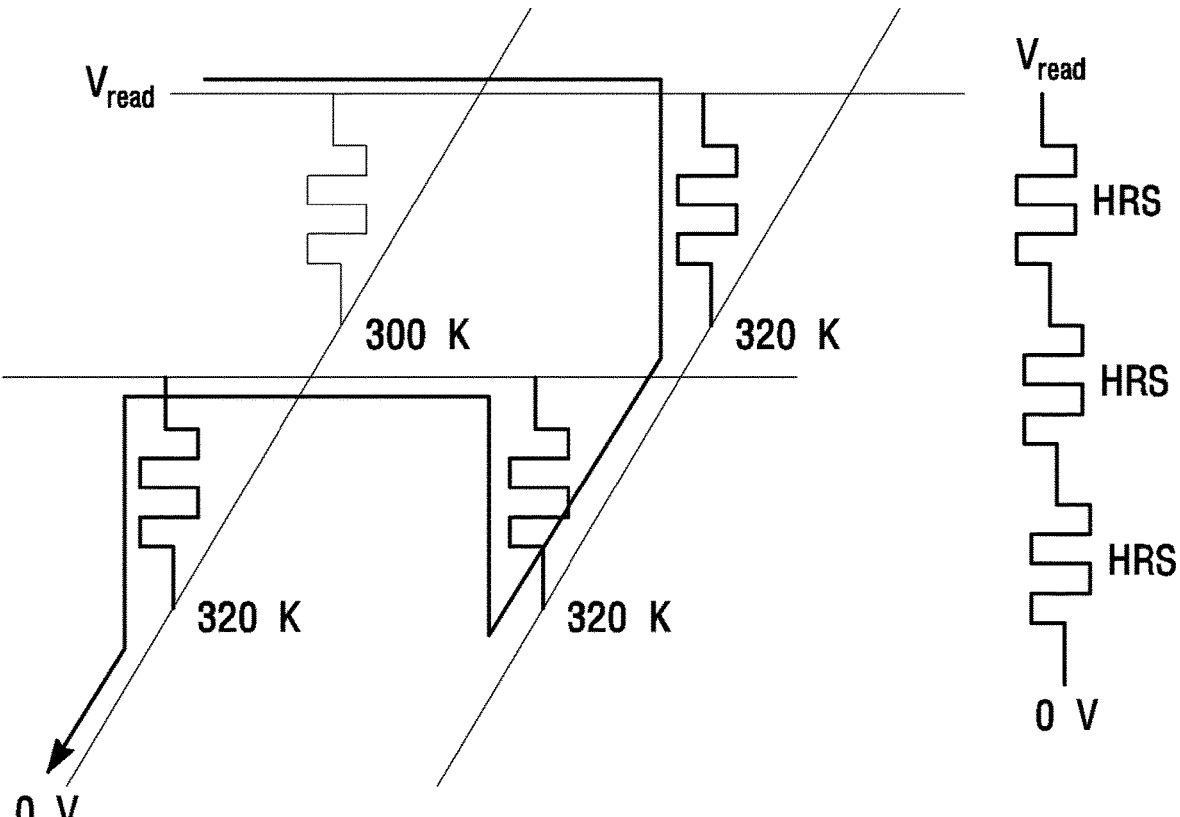
FIG. 8 illustrates explaining a leakage current of the semiconductor memory device according to an exemplary embodiment.

FIG. 8 is a diagram for explaining a leakage current of a semiconductor memory device according to an exemplary embodiment.

Referring to FIG. 8, heat leakage is not observed in the form of electricity in the semiconductor memory device according to the embodiment.

For example, when the semiconductor memory device is in the form of a 2-terminal crossbar, the possibility of a leakage current problem may be low because the resistance state is not changed and stored.

Thus the semiconductor memory device according to the exemplary embodiment is made of a material whose electrical characteristics are changed by heat and material that stores heat, it does not cause electrical leakage. Also, the resistance drift phenomenon of the device due to repetitive switching may not occur.

The preferred embodiment of the present invention has been described above, it will be understood by those skilled in the art that the present invention may be variously modified and changed within the spirit and area of the present invention described in the following patent claims.

What is claimed is:

1. A device comprising:
a first device layer storing thermal energy; and
a second device layer,
wherein the first device layer stores the thermal energy in response to a programming voltage being applied to the second device layer, thereby causing the device to be in a programmed state, in which the second device layer is changed from an insulating state to a conductive state by the programming voltage and the stored thermal energy is maintained in response to a read voltage applied to the second device layer,
wherein the second device layer comprises:
a first layer including a first material which is an electrically conductive material;
a second layer including a second material whose electrical properties are changed by the thermal energy; and
a third layer including a third material which is an electrically conductive material; and
wherein the second layer is disposed between the first layer and the third layer.

2. The device according to claim 1,
wherein the first material of the first layer is selected from a group consisting of metallic materials, semiconductive materials, or organic materials comprising Platinum(Pt), Titanium(Ti), Argentum(Ag), Aurum(Au), Ruthenium(Ru), Titanium nitride(TiN), Tungsten(W), Aluminium(Al), Indium Tin Oxide(ITO), Zinc Oxide (ZnO), IGZO, Indium Tin Zinc Oxide(ITZO), Nickel (II) oxide(NiO), Tin dioxide(SnO2), Graphene, or Molybdenum disulfide(MoS$_2$),
wherein the third conductive material of the third layer is selected from a group consisting of metallic materials, semiconductive materials, or organic materials comprising Platinum(Pt), Titanium(Ti), Argentum(Ag), Aurum(Au), Ruthenium(Ru), Titanium nitride(TiN), Tungsten(W), Aluminium(Al), Indium Tin Oxide (ITO), Zinc Oxide(ZnO), IGZO, Indium Tin Zinc Oxide(ITZO), Nickel(II) oxide(NiO), Tin dioxide(SnO2), Graphene, or Molybdenum disulfide(MoS$_2$).

3. The device according to claim 1, wherein the second material is a resistance change material whose resistance changes by temperature, or a material in which metal-insulator transition occurs at a specific temperature.

4. The device according to claim 3,
wherein the second material is a resistance change material comprising one or more selected from a group consisting of metal oxide-based, high molecular polymer-based, or low molecular compound-based material including vanadium oxide (VOx), niobium oxide (NbOx), tantalum oxide (TaOx), germanium antimony telluride (Ge2Sb2Te5) or zinc telluride (ZnTe).

5. The device according to claim 1,
wherein the first device layer comprises at least one sub-layer, and is disposed at an under portion, at a side portion, or at an upper portion of the second device layer, or is formed to surround the second device layer, and
wherein the first device layer is made of a material selected from a group consisting of a high molecular polymer-based material or a metal oxide-based material including polyimide, polyethylene terephthalate, polyether-sulfone, polyethylene naphthalate, polycarbonate, silicon (Si), silicon dioxide (SiO$_2$), glass, or aluminum oxide (AlOx).

6. The device according to claim 1, wherein in response to the thermal energy not being stored in the first device layer and in response to the read voltage being applied, a current does not flow in the second device layer.

7. The device according to claim 1, wherein in response to the thermal energy being stored in the first device layer and in response to the read voltage being applied, current flows in the second device layer.

8. The device according to claim 7,
wherein in response to the programming voltage being applied, the thermal energy is generated in the second layer of the second device layer by the programming voltage, thereby the thermal energy is stored in the first device layer.

9. The device according to claim 7,
wherein the device performs a refresh operation of generating heat to store the thermal energy in the first device layer by the programming voltage and maintaining the thermal energy stored in the first device layer by the read voltage.

10. The device according to claim 7,
wherein the device is operated by a driving method which includes:
a read operation for periodically reading 0 or 1 depending on a presence or absence of current in the second device layer by periodically applying the read voltage in a form of a voltage pulse train, and
an operation of maintaining the current state at 0 wherein the thermal energy is not generated when the current state of the second device layer is 0 by the read voltage, thereby the current state is maintained at 0 by maintaining the thermal energy of the first device layer.

11. The device according to claim 8,
wherein the device is operated by a driving method which includes:
a read operation for periodically reading 0 or 1 depending on a presence or absence of current in the second device layer by periodically applying the read voltage in a form of a voltage pulse train, and
an operation of maintaining the current state at 0 wherein the thermal energy is generated when the current state of the second device layer is 1 by the read voltage, to perform a refresh operation with the read voltage, thereby the current state is maintained at 1 by maintaining the thermal energy of the first device layer.

* * * * *